(12) United States Patent
Kerner et al.

(10) Patent No.: US 11,271,590 B2
(45) Date of Patent: Mar. 8, 2022

(54) APPARATUS AND METHOD FOR WLAN RANGE EXTENSION

(71) Applicant: Apple Inc., Cupertino, CA (US)

(72) Inventors: Michael Kerner, Herzliya (IL); Koby Vainapel, Herzliya (IL); Shay Gershoni, Hadera (IL)

(73) Assignee: Apple Inc., Cupertino, CA (US)

( * ) Notice: Subject to any disclaimer, the term of this patent is extended or adjusted under 35 U.S.C. 154(b) by 260 days.

(21) Appl. No.: 16/126,488

(22) Filed: Sep. 10, 2018

(65) Prior Publication Data
US 2020/0083903 A1    Mar. 12, 2020

(51) Int. Cl.
| | |
|---|---|
| *H03M 13/11* | (2006.01) |
| *H04L 1/18* | (2006.01) |
| *H04W 72/08* | (2009.01) |
| *H04W 84/12* | (2009.01) |
| *H04L 1/00* | (2006.01) |

(52) U.S. Cl.
CPC ....... *H03M 13/1125* (2013.01); *H04L 1/1809* (2013.01); *H04L 1/1835* (2013.01); *H04W 72/082* (2013.01); *H04L 1/0003* (2013.01); *H04L 1/1812* (2013.01); *H04W 84/12* (2013.01)

(58) Field of Classification Search
CPC ........................ H03M 13/1125; H04L 1/1809; H04L 1/1835; H04L 1/1812; H04L 1/1816; H04L 1/0003; H04W 84/12; H04W 72/082

USPC ......................................................... 375/260
See application file for complete search history.

(56) References Cited

U.S. PATENT DOCUMENTS

| | | | | |
|---|---|---|---|---|
| 2009/0290524 | A1* | 11/2009 | Seok ...................... | H04L 1/1829 370/312 |
| 2011/0216857 | A1* | 9/2011 | Gotman ................ | H03M 13/27 375/341 |
| 2017/0126363 | A1* | 5/2017 | Wang .................... | H04L 1/1671 |
| 2018/0019900 | A1* | 1/2018 | Sun ....................... | H04L 1/0071 |
| 2018/0375616 | A1* | 12/2018 | Beale ....................... | H04L 1/08 |
| 2020/0154423 | A1* | 5/2020 | Wang ................... | H04W 74/08 |
| 2020/0374043 | A1* | 11/2020 | Lei ..................... | H04W 72/0413 |

* cited by examiner

*Primary Examiner* — Kevin M Burd
(74) *Attorney, Agent, or Firm* — Sterne, Kessler, Goldstein & Fox P.L.L.C.

(57) ABSTRACT

Some embodiments enable improved packet error rate (PER), signal to noise ratio (SNR), channel capacity, aggregated throughput, and communication range in wireless communication systems. For example, an electronic device includes a buffer that stores a first descrambled bit estimate sequence. The electronic device further includes an encoder that receives a descrambling sequence and generates an encoded descrambling sequence and a multiplier circuit that receives a bit estimate sequence and the encoded descrambling sequence and generates a second descrambled bit estimate sequence. The electronic device also includes an adder circuit that combines the first descrambled bit estimate sequence and the second descrambled bit estimate sequence and a decoder that decodes the combined descrambled bit estimate sequence.

20 Claims, 8 Drawing Sheets

APPARATUS AND METHOD FOR WLAN RANGE EXTENSION

BACKGROUND

Field

The described embodiments generally relate to improvements in aggregated signal to noise ratio (SNR) and range extension in wireless communications.

Related Art

In wireless local area networks (WLANs) the maximum range can be limited by the lowest Modulation and Coding Scheme (MCS) index value (e.g., MCS0) and/or the lowest value of complementary code keying (CCK) modulation scheme (e.g., 1 Mbit/sec). MCS index values are combination of number of spatial streams, modulation type, and coding rate. Additionally, because of the scrambling processing in transmitters in WLANs, the receivers in WLANs cannot use soft combining of multiple transmissions. The payload of multiple transmissions received at the receiver are scrambled using different scrambling sequences. Therefore, even if the receiver in WLAN is implementing hybrid automatic repeat request (hybrid ARQ—HARQ), the receiver cannot combine the multiple transmissions.

SUMMARY

Some embodiments include an electronic device, method, and computer program product for implementing HARQ and soft combining of multiple transmissions. According to some embodiments, because descrambling and encoding (the encoding done at a transmitter electronic device) can be linear operations, the order of the descrambling and decoding at a receiver electronic device can be changed. In other words, the payloads of received frames can be descramble first before they are decoded, according to some embodiments. By descrambling before decoding, the receiver electronic device can be able to combine payload of multiple transmissions received at the receiver electronic device. The HARQ and soft combining of multiple transmissions can improve packet error rate (PER), signal to noise ratio (SNR), channel capacity, aggregated throughput, and communication range. In some embodiments, the improvements in SNR translate to range extension of the communication system.

Some embodiments include an electronic device, method, and computer program product for decoding headers (e.g., MAC headers) of received frames in early stages of frame reception. The information within the headers can be used for implementing the HARQ and soft combining of multiple transmissions.

Some embodiments relate to an electronic device. The electronic device includes a buffer that stores a first descrambled bit estimate sequence. The electronic device further includes an encoder that receives a descrambling sequence and generates an encoded descrambling sequence and a multiplier circuit that receives a bit estimate sequence and the encoded descrambling sequence and generates a second descrambled bit estimate sequence. The encoder can include a forward error correction (FEC) encoder. The electronic device also includes an adder circuit that combines the first descrambled bit estimate sequence and the second descrambled bit estimate sequence and a decoder that decodes the combined descrambled bit estimate sequence.

Some embodiments relate to an electronic device. The electronic device includes a memory that stores program instructions and a first descrambled bit estimate sequence and a processor. The processor, upon executing the program instructions, receives a descrambling sequence and generates an encoded descrambling sequence. The processor further receives a bit estimate sequence and the encoded descrambling sequence and generates a second descrambled bit estimate sequence. The processor also determines that the second descrambled bit estimate sequence corresponds to a retransmission of the first descrambled bit estimate sequence and, in response to the determination, combines the first descrambled bit estimate sequence and the second descrambled bit estimate sequence. The processor also decodes the combined descrambled bit estimate sequence.

Some embodiments relate to a method. The method includes receiving a descrambling sequence and generating an encoded descrambling sequence. The method further includes receiving a bit estimate sequence and the encoded descrambling sequence and generating a first descrambled bit estimate sequence based at least in part on the bit estimate sequence and the encoded descrambling sequence. The method also includes determining that the first descrambled bit estimate sequence corresponds to a retransmission of a stored second descrambled bit estimate sequence. In response to the determination, the method further includes combining the first descrambled bit estimate sequence and the stored second descrambled bit estimate sequence. The method also includes decoding the combined descrambled bit estimate sequence.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE FIGURES

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1:
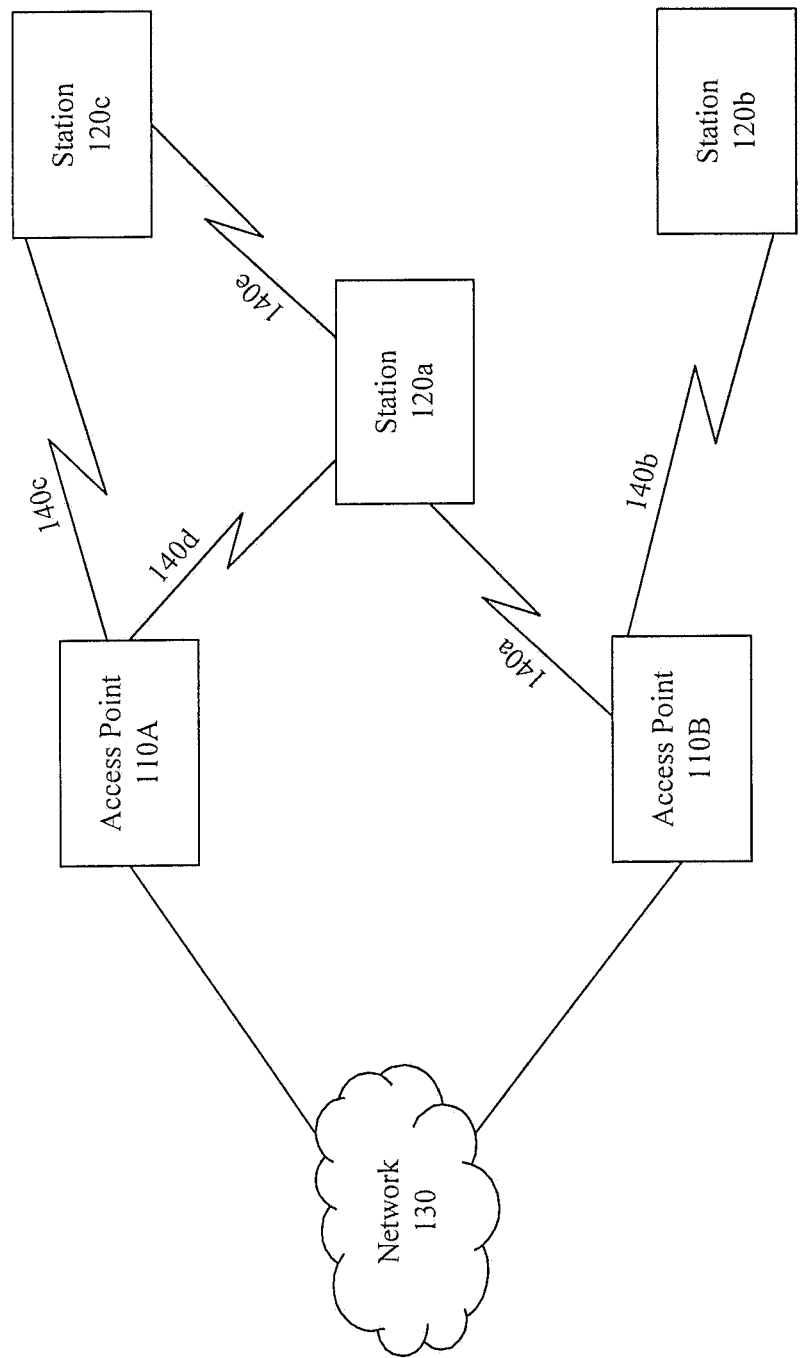
FIG. 1 illustrates an example system implementing an HARQ and soft combining of multiple transmissions, according to some embodiments of the disclosure.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Some embodiments enable communicating wireless local area network (WLAN) electronic devices to improve packet error rate (PER) and signal to noise ratio (SNR), and increase the range of the WLAN. The WLAN devices may implement hybrid automatic repeat request (hybrid ARQ—HARQ) and soft combining of multiple transmissions to improve PER, channel capacity, and aggregated throughput. Additionally, the WLAN electronic devices may be configured to descramble of data before decoding the data such that the WLAN electronic device may implement the HARQ and soft combining of multiple transmissions.

In some examples, implementing the methods and systems of this disclosure improves the PER of payloads of frames by taking advantage of HARQ and soft combining of multiple transmissions. Since the noise (e.g., channel noise) affecting the transmission of the frames can be considered to be random, combining two or more payloads of two or more frames decreases the effect of the noise and therefore, can decrease the PER. It is noted that the improvements in the PER of the payload of a frame can be limited by the PER of the header of that frame, according to some examples. Generally the PER of the header of the frame is less than the PER of the payload of that frame for the same channel condition. According to some examples, using the systems and methods of this disclosure can improve the PER of the payload by a gain of, for example, 2 dB. This gain is an exemplary gain and this disclosure is not limited to this example.

FIG. 1 illustrates an example system 100 implementing an HARQ and soft combining of multiple transmissions, according to some embodiments of the disclosure. Example system 100 is provided for the purpose of illustration only and is not limiting of the disclosed embodiments. System 100 may include, but is not limited to, stations 120, access points 110, and network 130. Stations 120a-120c may include, but are not limited to, Wireless Local Area Network (WLAN) stations such as wireless communication devices, smart phones, laptops, desktops, tablets, personal assistants, monitors, televisions, and the like. Access point (AP) 110 may include but are not limited to WLAN electronic devices such as a wireless router, a wearable device (e.g., a smart watch), a wireless communication device (e.g., a smart phone), or a combination thereof. Network 130 may be the Internet and/or a WLAN. Station 120 communications are shown as wireless communications 140.

Station 120 can implement error control methods for data transmission and/or data reception. For example, station 120 can be configured to implement HARQ as the error control method. The HARQ can be a combination of using forward error correcting coding and the ARQ. In the ARQ, error detecting code can be used by, for example, station 120 to determine whether any error occurred during the transmission of data from, for example, AP 110. The error detecting code can include cyclic redundancy check (CRC), according to some examples. The forward error correcting coding of the HARQ can be used by, for example, station 120 to correct some of the errors occurred during transmission of the data from, for example, AP 110. It is noted that HARQ used by station 120 and/or AP 110 can include any HARQ mechanisms such as, but not limited to, Type I HARQ, Type II HARQ, or the like.

According to some embodiments, station 120 and/or AP 110 implement HARQ with soft combining of multiple transmissions. In these embodiments, when station 120 receives a coded data block transmitted from AP 110, station 120 is configured to determine whether the received coded data block has any errors. The errors in the received coded data block can occur during the transmission of the data blocks. If station 120 determines that the received coded data block has error(s) and station 120 determines that station 120 cannot correct the errors using, for example, forward error correcting code(s), station 120 can store the received coded data block, instead of discarding it, and also send a negative acknowledgment to AP 110. In some examples, by sending the negative acknowledgment, station 120 informs AP 110 that the coded data block was received with errors. AP 110 uses the negative acknowledgment to retransmit the coded data block to station 120. It is noted that although an example of stop-and-wait mode of HARQ is discussed above, the embodiments of this disclosure are not limited to this example and AP 110 and/or station 120 can implement other modes of HARQ.

When station 120 receives the retransmitted coded data packet, station 120 can determine whether the retransmitted coded data packet also includes any errors. If station 120 determines that the retransmitted coded data packet also includes error(s) and determines that the forward error correcting code(s) does not correct the error(s), station 120 can combine the coded data block and the retransmitted coded data block. In other words, although the coded data block and the retransmitted coded data block, individually, were not correctly decoded at station 120, it is possible that station 120 can correctly decode the combination of the coded data block and the retransmitted coded data block. Therefore, instead of discarding the data block(s) and/or retransmitted data block(s) that were not correctly decoded, station 120 is configured to combine these data blocks to increase the probability that their combination can be decoded correctly.

According to some embodiments, in order to determine to combine two coded data blocks, station 120 is configured to examine, for example, a MAC header of each of the coded data blocks. By examining the MAC headers, station 120 can determine whether one of the two coded data blocks is a retransmission of the other one of the two coded data blocks. For example, by examining the MAC headers, station 120 can determine the identifier (e.g., an address) of the transmitter transmitting the coded data blocks, the identifier (e.g., an address) of the intended receiver of the coded data blocks, and/or traffic identifiers (TIDs) associated with the coded data blocks. Using the determined identifiers and TID, station 120 is configured to determine whether one of the two coded data blocks is a retransmission of the other one of the two coded data blocks. If station 120 determines that one of the two coded data blocks is a retransmission of the other one of the two coded data blocks, station 120 combines the two coded data blocks. In other words, station 120 can determine whether a second (e.g., current coded data block) is a retransmission of a first (e.g., previous coded data block), and combine them if so.

It is noted that station 120 can examine other fields within the MAC headers of the coded data blocks in determining whether one of the two coded data blocks is a retransmission of the other one of the two coded data blocks. For example, station 120 can examine the MAC headers to determine whether a retry field in the MAC header(s) is set, can determine whether the coded data blocks are data frames, control frames, management frames or the like.

According to some examples, the two coded data blocks include same information (e.g., data and parity bits.) In these examples, station 120 can be configured to use maximum-ratio combining to combine the two coded data blocks. Alternatively, the two coded data blocks may not include the same information, however, the two coded data blocks might have been generated from same set of information bits but using different portions of the same set of information bits. It is noted that the above exemplary HARQ implementations are provided as examples and other combination processes can be used in HARQ implementations of station 120 and/or AP110.

Also, it is noted that although some embodiments are discussed with respect to WLAN, the embodiments of this disclosure are not limited to WLAN and can be used for other communication systems.

Figure 2:
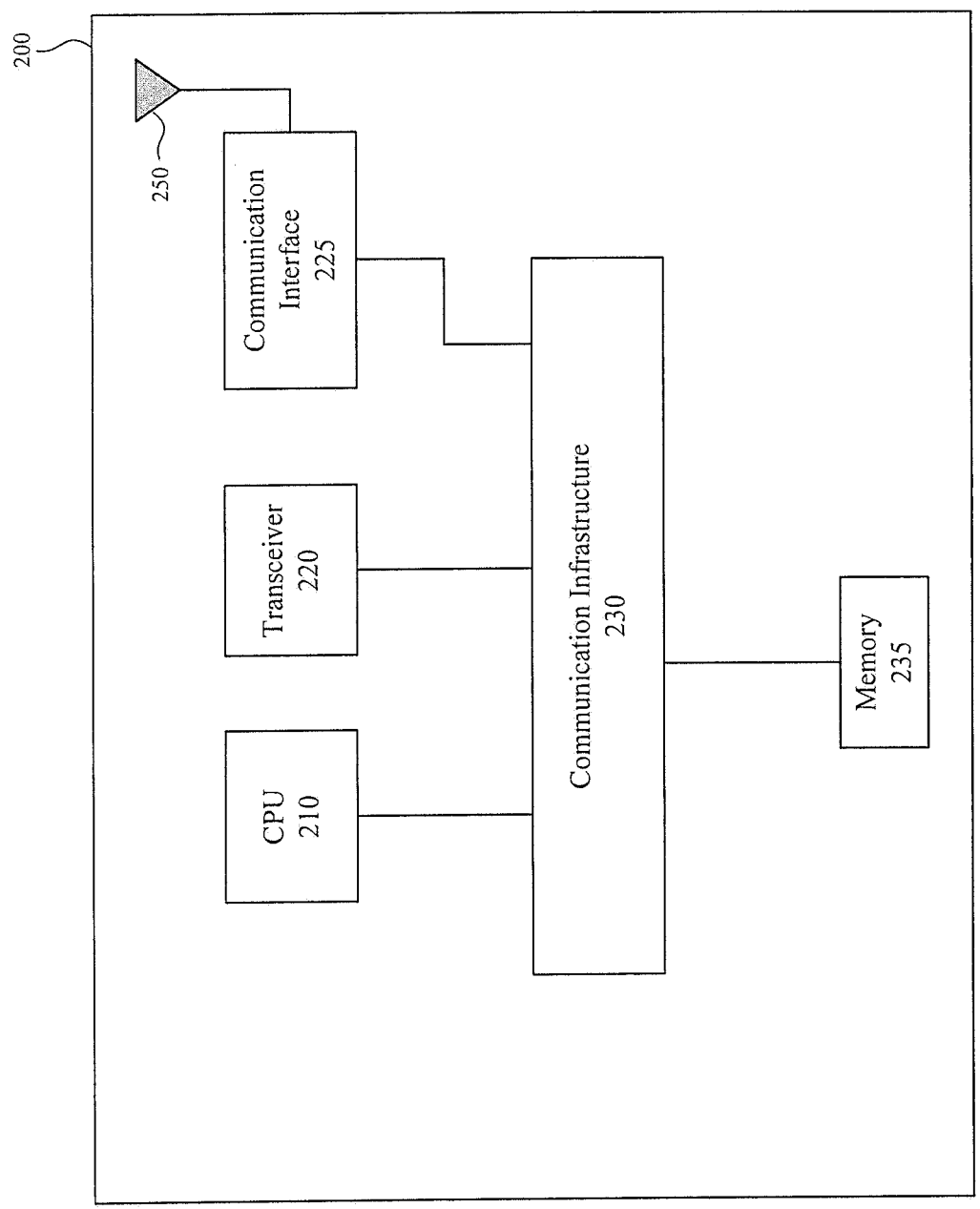
FIG. 2 illustrates a block diagram of an example wireless system supporting an HARQ and soft combining of multiple transmissions, according to some embodiments of the disclosure.

FIG. 2 illustrates a block diagram of an example wireless system 200 supporting HARQ and soft combining of multiple transmissions, according to some embodiments of the disclosure. System 200 may be any of the electronic devices (e.g., 110, 120) of system 100. System 200 includes central processing unit (CPU) 210, transceiver 220, communication interface 225, communication infrastructure 230, memory 235, and antenna 250. Memory 235 may include random access memory (RAM) and/or cache, and may include control logic (e.g., computer software) and/or data. CPU 210 together with instructions stored in memory 235 perform operations enabling HARQ and soft combining of multiple transmissions. In some embodiments CPU 210 and instructions in memory 235 together perform operations enabling HARQ and soft combining of multiple transmissions. Transceiver 220 transmits and receives communications signals including packet structures that support HARQ and soft combining of multiple transmissions according to some embodiments, and may be coupled to antenna 250. Communication interface 225 allows system 200 to communicate with other devices that may be wired and/or wireless. Communication infrastructure 230 may be a bus. Antenna 250 may include one or more antennas that may be the same or different types.

Figure 3:
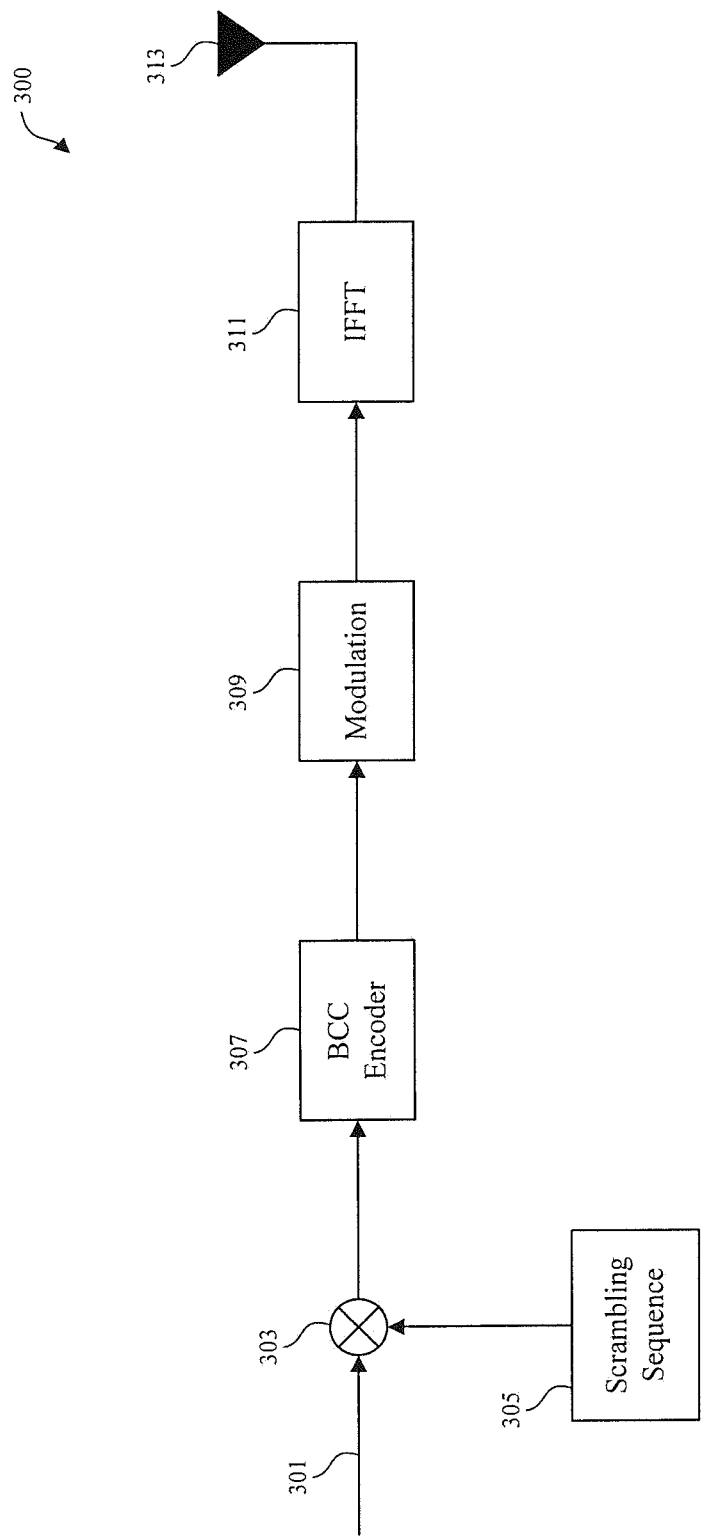
FIG. 3 illustrates a block diagram of an example wireless system of a transmitter electronic device supporting HARQ and soft combining of multiple transmissions, according to some embodiments of the disclosure.

FIG. 3 illustrates a block diagram of an example wireless system 300 of a transmitter electronic device supporting HARQ and soft combining of multiple transmissions, according to some embodiments of the disclosure. System 300 can be any of the electronic devices (e.g., 110, 120) of system 100. For example, system 300 can be part of transceiver 220, communication interface 225, and/or communication infrastructure 230 of system 200 of FIG. 2. According to some embodiments, system 300 is configured as part of a transmitter electronic device and can be used to transmit data to a receiver electronic device.

System 300 can receive payload bits 301. According to some embodiments, payload bits 301 are used to generate the payload of a frame to be transmitted to the receiver electronic device. System 300 is configured to scramble payload bits 301 before encoding them. According to some examples, system 300 can include XOR circuit 303 and scrambling sequence 305 for scrambling payload bits 301. However, system 300 can include other circuits configured for scrambling payload bits 301. Payload bits 301 are scrambled using scrambling sequence 305 and XOR circuit 303.

The scrambled payload bits are input to encoder 307. Encoder 307 is configured to encode the scrambled payload bits. According to some embodiments, encoder 307 can include a Binary Convolution Code (BCC) encoder (for example, but not limited to, a 1/2 rate convolutional encoder.) Additionally or alternatively, encoder 307 can include a low-density parity-check (LDPC) encoder and/or an FEC encoder. However, the embodiments of this disclosure are not limited to these examples and encoder 307 can include other implementations.

According to some examples, the encoded payload bits are input to modulation circuit 309. Modulation circuit 309 is configured to map the encoded payload bits to complex values using a selected modulation scheme. Although not shown, system 300 can also include an interleaving circuit between encoder 307 and modulation circuit 309. The interleaving circuit can be configured to interleave the encoded payload bits.

The modulated payload bits are input to inverse Fast Fourier Transform (IFFT) circuit 311. IFFT circuit 311 is configured to translate the modulated payload bits from the frequency domain to the time domain samples. The time domain samples are transmitted using antenna 313.

It is noted that the circuits illustrated in system 300 of FIG. 3 are provided as examples. System 300 can include fewer or additional circuits. For example, system 300 can include a pilot insertion circuit configured to insert pilot tones onto subcarriers before IFFT circuit 311. System 300 can also include a circuit configured to insert a preamble to the time domain samples. System 300 can also include a cyclic prefix insertion circuit for inserting cyclic prefix to the time domain samples and/or an interpolation circuit, for example, between IFFT circuit 311 and antenna 313.

Figure 4:
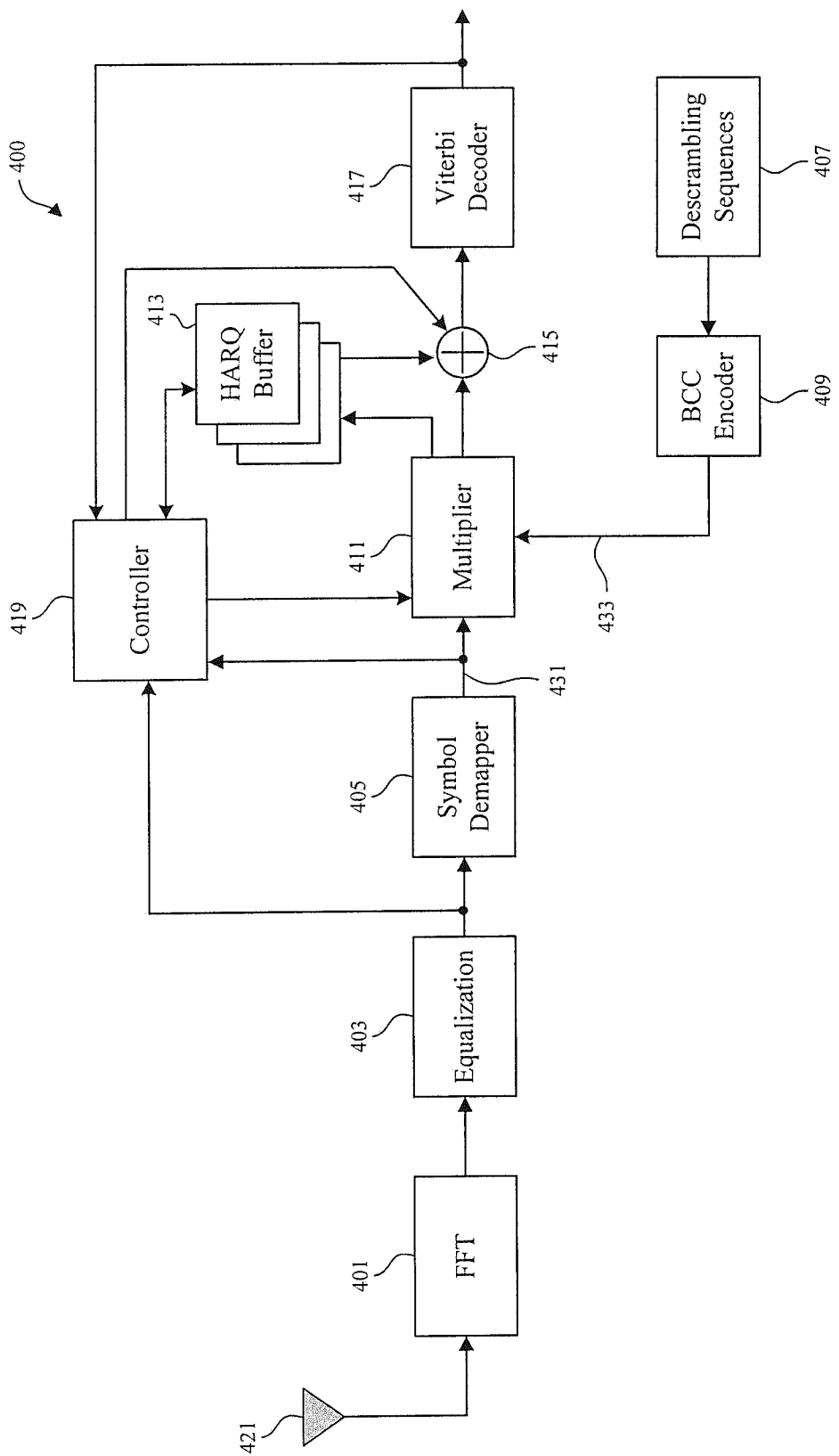
FIG. 4 illustrates a block diagram of an example wireless system of a receiver electronic device supporting HARQ and soft combining of multiple transmissions, according to some embodiments of the disclosure.

FIG. 4 illustrates a block diagram of an example system 400 of a receiver electronic device supporting HARQ and soft combining of multiple transmissions, according to some embodiments of the disclosure. System 400 can be any of the electronic devices (e.g., 110, 120) of system 100. For example, system 400 can be part of the transceiver 220, communication interface 225, and/or communication infrastructure 230 of system 200 of FIG. 2. According to some embodiments, system 400 is configured as part of a receiver electronic device and can be used to receive data from a transmitter electronic device.

According to some examples, system 400 receives the time domain samples using antenna 421. The time domain samples can include complex baseband samples. The received time domain samples are input to FFT circuit 401. According to some examples, FFT circuit 401 is configured to transform the received time domain samples to frequency samples.

The output of FFT circuit 401 is input to equalization circuit 403, according to some examples. Equalization circuit 403 is configured to receive the frequency domain samples and equalize the samples using, for example, a channel frequency response. For examples, equalization circuit 403 is configured to remove amplitude and phases errors of the frequency domain samples that have occurred during the transmission of the time domains sample over the channel.

The output of equalization circuit 403 can be input to symbol demapper circuit 405. According to some examples, symbol demapper circuit 405 is configured to receive the equalized frequency domain samples and generate a bit estimate sequence 431. According to some examples, symbol demapper circuit 405 can include a circuit that performs log-likelihood ratio (LLR) estimation to generate the bit estimate sequence. The generated bit estimate sequence are estimates for the data bits input to symbol demapper circuit 405. According to some examples, the data bits input to symbol demapper circuit 405 correspond to the output of encoder 307 of system 300. According to some embodiments, the output of symbol demapper circuit 405 (bit estimate sequence) is an estimate for each input bit input to symbol demapper circuit 405. For example, a high positive value of a bit estimate indicates a high probability that the input bit to symbol demapper circuit 405 is 1. On the other hand, a high negative value of a bit estimate indicates a high probability that the input bit is 0.

The system 400 uses the bit estimate sequence 431 to construct the payload of frames received at the system 400. Additionally, system 400 determines whether the received frames are retransmission frames corresponding to one or more frames already received at system 400. In other words, system 400 can determine whether one or more received frames are retransmission frames that contain the same payload bits as payload bits stored in buffers 413. According to some embodiments, if the received frames are retransmission frames corresponding to one or more frames already received at system 400, system 400 is configured to combine the payloads of the received frames with one or more stored payloads using descrambling sequences 407, encoder 409, multiplier circuit 411, buffers 413, and adder circuit 415.

According to some examples, controller 419 is configured to examine the header (e.g., the MAC header) of the received frames to determine whether a received frame is a retransmission frame corresponding to a frame previously received by system 400. In one example, controller 419 is configured to examine the MAC header of the received frame after the MAC header is decoded by decoder 417. For example, the payload of the received frame (e.g., the data portion of the received frame) and/or bit estimate sequence 431 associated with the received frame can be buffered (e.g., using buffers 413 with or without controller 419) while the MAC header of the received frame is decoded by decoder 417. Controller 419 examines the decoded MAC header to determine whether the received frame is a retransmission frame corresponding to a previously received frame. In another example, controller 419 is configured to examine data bits input to symbol demapper circuit 405 for examining the MAC header of the received frame. Therefore, the MAC header can be decoded during early stages of frame reception such that the information within the MAC header will be used for implementing the soft combination. However, the embodiments of this disclosure are not limited to this example and other implementations can be used such that the MAC header of the received frame is decoded and examined during early stages of frame reception.

Figure 5:
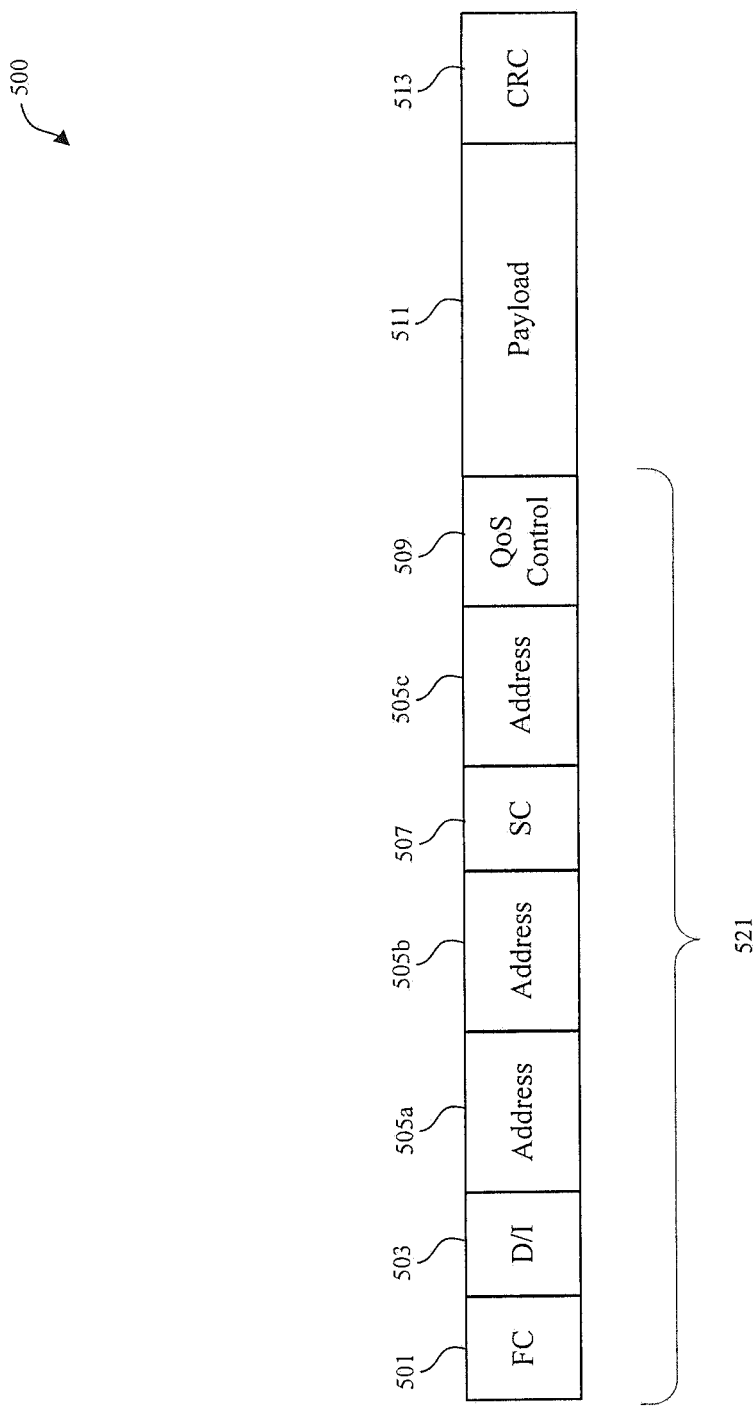
FIG. 5 illustrates a frame format, according to some embodiments of the disclosure.

As discussed in more detail with respect to FIG. 5, the MAC header of the received frame can include information associated with whether the frame is a data frame, a control frame, or a management frame; whether the frame is a retransmission frame; an identifier of a transmitter that transmitted the frame; an identifier of the receiver intended to receive the frame; the TID associated with the frame; and other information. By examining the MAC header, controller 419 can be configured to retrieve these information. It is noted that controller 419 can be configured to determine other information associated with the received frame using the MAC header of the received frame.

According to some examples, after examining the MAC header, controller 419 can determine that the received frame is destined for the system 400. Using the determined identifier of the transmitter transmitting the frame and the TID, controller 419 determines whether any other payload of frames from the same transmitter and the same TID are stored in buffers 413. For example, controller 419 can compare the determined identifier of the transmitter transmitting the frame and the associated TID with the identifiers of the transmitters and the corresponding TIDs of the one or more payloads of one or more frames stored in buffers 413.

If controller 419 determines that one or more payloads of one or more frames with same transmitter address and same TID are stored in buffers 413, system 400 combines the payload of the received frame with the payload(s) of the one or more stored frames having the same TID. However, if controller 419 determines that the received frame is not a retransmission of any of the stored frames, system 400, using, for example, controller 419, can determine whether the received frame has any errors. If system 400 determines that the received frame has errors, instead of discarding it, system 400, using for example controller 419, can store the received frame in one of buffers 413.

To combine the payloads of the received frame and the one or more stored frames, system 400 combines bit estimate sequence 431 with stored descrambled bit estimates using descrambling sequences 407, encoder 409, multiplier circuit 411, and adder circuit 415. It is noted that the bit estimate sequence 431 is generated based on the payload bits of the received frame. The payload bits of the received frame were scrambled using scrambling sequences, such as scrambling sequences 305 at the transmitter. These same sequences, which were used at the transmitter to transmit the received frame, are used to descramble the bit estimate sequence 431. In other words, descrambling sequences 407 used by the receiver electronic device of system 400 are the same as scrambling sequences 305 used by the transmitter electronic device of system 300 for the same frame. According to some examples, descrambling sequence 407 is initialized based on the first decoded bits of output of decoder 417.

According to some embodiments, descrambling sequences 407, are first encoded using encoder 409. According to some embodiments, encoder 409 can include a Binary Convolution Code (BCC) encoder (for example, but not limited to, a 1/2 rate convolutional encoder.) Additionally or alternatively, encoder 409 can include a low-density parity-check (LDPC) and/or a forward error correction (FEC) encoder. However, the embodiments of this disclosure are not limited to these examples and encoder 409 can include other implementations. For example, encoder 409 can include encoders with linear operations. According to some embodiments, the output of encoder 409 can include a sequences of +1 and −1.

The bit estimate sequence 431 is multiplied by the output of encoder 409 (encoded descrambling sequence 433.) The output of multiplier circuit 411 is a descrambled bit estimate sequence. The descrambled bit estimate sequence is conditionally combined with one or more stored descrambled bit estimate sequence(s) from buffers 413, as discussed above. For example, and as discussed above, if controller 419 (after examining the MAC header associated with the descrambled bit estimate sequence) has determined that the descrambled bit estimate sequence is to be combined with one or more stored descrambled bit estimate sequence(s) from buffers 413, controller 419 can control buffers 413 to provide the one or more stored descrambled bit estimate sequence(s) to adder circuit 415. Additionally or alternatively, controller 419 can control adder circuit 415 to receive and/or retrieve the descrambled bit estimate sequence from multiplier circuit 411 and the one or more stored descrambled bit estimate sequence(s) from buffer 413, and combine them.

However, as discussed above, if controller 419 (after examining the MAC header associated with the descrambled bit estimate sequence) has determined that the descrambled bit estimate sequence is not to be combined with any stored descrambled bit estimate sequence from buffers 413, controller 419 can control buffers 413 such that no stored descrambled bit estimate sequence is provided to adder circuit 415. Additionally or alternatively, controller 419 can control adder circuit 415 to pass through the descrambled bit estimate sequence from multiplier circuit 411 without combining the descrambled bit estimate sequence with any other sequence. According to some example, controller 419 can also control multiplier circuit 411 and/or buffers 413 to store the descrambled bit estimate sequence in buffers 413.

The combined descrambled bit estimate sequence that is associated with the combined payloads is input to decoder 417. Decoder 417 is configured to decode the combined descramble bit estimate sequence to provide decoded bits. According to some embodiments, decoder 417 can include a Viterbi decoder. The decoded bits can be sent to upper layers of the system 400 for further analysis and/or use. In one examples, the first decoded bits can be used to initialize descrambling sequence 407. The decoded bits can also be examined to determine whether any error has occurred during the propagation of the frames on the channel and/or during the reception of the frames. In some embodiments, controller 419 can be configured to examine the decoded bits. If system 400 determines that any error has occurred and is not configured to correct the error, system 400 can be configured to send a negative acknowledgment to the transmitter that transmitted the frame. In response to receiving the negative acknowledgment, the transmitter can retransmit the frame. System 400 can combine the payload of the retransmitted frame with the previously transmitted or retransmitted frames to decrease the probability of error in received frames.

According to some embodiments, the system 400 is configured to use the HARQ and the combination of the payloads of multiple transmissions by descrambling before the decoder 417. In other words, since the operation of encoder 409 can be linear, descrambling sequences 407 can be encoded using encoder 409 and the encoded descrambling sequences 433 can be applied to the bit estimate sequence 431 before the decoder 417. Therefore, since the descrambling can occur before decoder 417, system 400 can be configured to use HARQ with soft combining of multiple transmissions to improve PER, channel capacity, and aggregated throughput.

Although the descrambling of the bit estimate sequence 431 is illustrated using multiplier circuit 411, the embodiments of this disclosure are not limited to this example and other implementations can also be used. Also, it is noted that the circuits illustrated in system 400 of FIG. 4 are provided as examples. System 400 can include fewer or additional circuits. For example, system 400 can include a correlation circuit and a synchronization circuit before FFT circuit 401 for searching for and establishing timing information and synchronizing the system 400 using the timing information. Additionally, system 400 can include a de-interleaves circuit, according to some examples. System 400 can also include a cyclic prefix removal circuit for removing cyclic prefix from the time domain samples and/or a decimation circuit, for example, between antenna 421 and FFT circuit 401.

FIG. 5 illustrates a frame format, according to some embodiments of the disclosure. frame 500 can be part of one or more frames transmitted by any of the electronic devices (e.g., 110, 120) of system 100. For example, frame 500 can be part of one or more frames transmitted by AP 110 to station 120.

According to some examples, frame 500 can include frame control 501. Frame control 501 can provide control information. For example, frame control 501 can indicate whether frame 500 is a control frame, a management frame, or a data frame. According to some examples, frame control 501 can indicate whether frame 500 is a retransmission frame—a retransmission of a frame that was recently transmitted but was not received correctly. For example, frame control 501 can include a field to indicate whether frame 500 is a retransmission frame. In some examples, frame control 501 can include two bytes. However, the embodiments of this disclosure are not limited to this example.

Frame 500 can also include a duration field 503. The duration field 503 can include information indicating the duration of frame 500. The duration field 503 can indicate how long the transmission of frame 500 will take. Duration field 503 can include two bytes. However, the embodiments of this disclosure are not limited to this example.

Frame 500 can include one or more addresses 505a, 505b, and 505c (collectively referred to as address 505), according to some embodiments. For example, address 505a can be the address of the transmitter (e.g., AP 110.) Address 505b, can be the address of the receiver (e.g., station 120.) According to some embodiments, the transmitter address and the receiver address are the MAC addresses of the transmitter and the receiver, respectively. In some examples, the address 505c or address fields in frame 500 can include address of source and/or destination devices that are the ultimate source and/or destination of frame 500. Frame 500 can include one or more address fields 505. Each address field 505 can include six bytes, according to some examples. However, the embodiments of this disclosure are not limited to this example.

Frame 500 can include sequence control 507 used for fragmentation and reassembly and to number frames sent between the transmitter (e.g., AP 110) and the receiver (e.g., station 120.) Sequence control 507 can include two bytes, according to some examples. However, the embodiments of this disclosure are not limited to these examples.

Frame 500 can include quality of service (QoS) control 509. According to some examples, QoS control 509 can include a field indicating the traffic identifier (TID). In some examples, The TID field of QoS control 509 can include four bit. The TID can indicate the stream of frames to which frame 500 belongs. According to some embodiments, a transmitter electronic device can transmit multiple streams of frames with different QoS requirements. The TID is used to differentiate between the multiple stream of frames. QoS control 509 can include two bytes, according to some examples. However, the embodiments of this disclosure are not limited to these examples.

Frame 500 can include frame body or payload 511. According to some examples, payload 511 can contain a MAC service data unit (MSDU) or portions of an MSDU. Payload 511 can include 0 to 8000 bytes, according to some examples. However, the embodiments of this disclosure are not limited to these examples.

Frame 500 can also include a frame check sequence 513. Frame check sequence 513 can include a cyclic redundancy check (CRC). Frame check sequence 513 can include four bytes in some examples. However, the embodiments of this disclosure are not limited to these examples.

According to some examples, frame control 501, duration field 503, address(es) 505, sequence control 507, and QoS control 509 are considered as MAC header 521 of frame 500. And payload 511 is the payload of frame 500. The embodiments of this disclosure are not limited to this example, and MAC header 521 can include additional or fewer fields.

Figure 6:
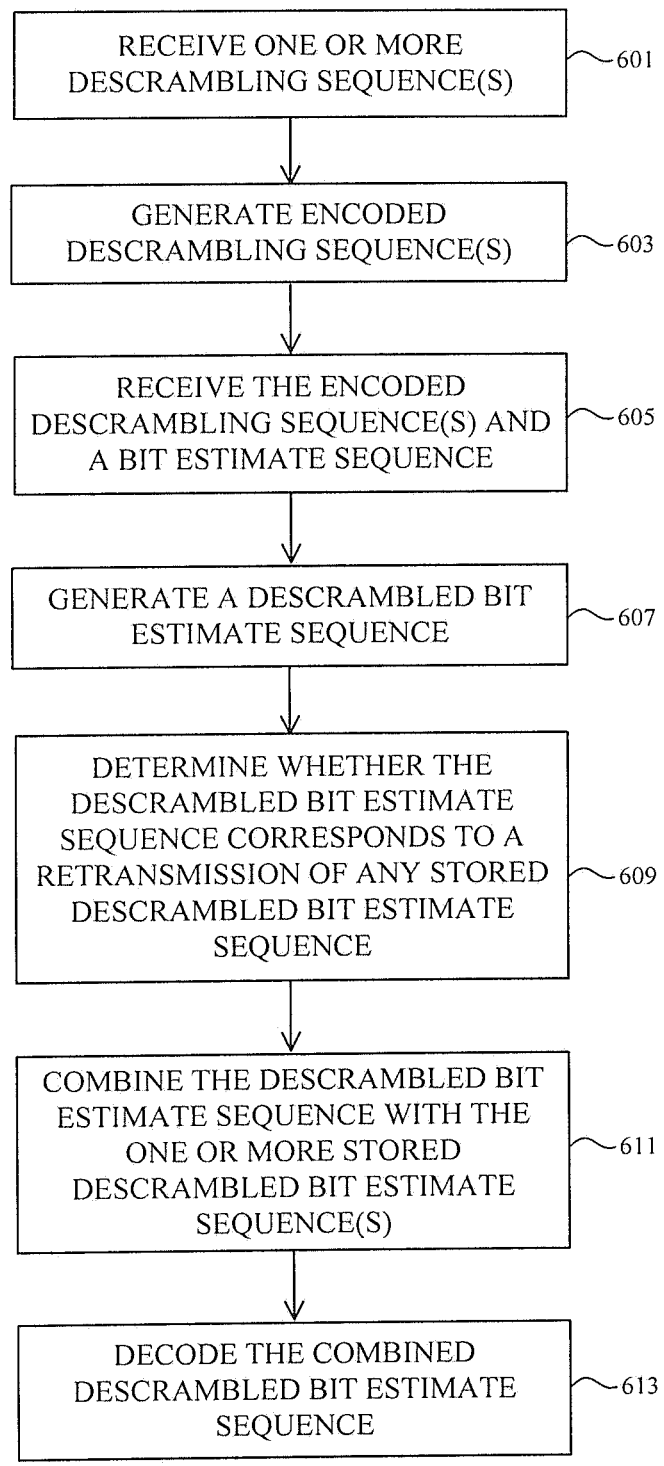
FIG. 6 illustrates an example method for soft combining of multiple transmissions, according to some embodiments of the disclosure.

FIG. 6 illustrates an example method 600 for soft combining of multiple transmissions, according to some embodiments. As a convenience and not a limitation, FIG. 6 is described with respect to FIGS. 1, 4, and 5. However, method 600 not limited to the specific embodiments depicted in those figures and other systems may be used to perform the method as will be understood by those skilled in the arts. It is to be appreciated not all steps may be needed, and the steps may not be performed in the same order as shown in FIG. 6.

At 601, an encoder, such as encoder 409 of FIG. 4, receives one or more descrambling sequences. At 603, the encoder generates encoded descrambling sequence(s) 433. At 605, a descrambling circuit, such as multiplier circuit 411 of FIG. 4 receives the encoded descrambling sequence(s) 433. The descrambling circuit also receives a bit estimate sequence. According to some embodiments, the bit estimate sequence is generated by, for example, symbol demapper circuit 405 from a bit sequence that correspond to payload 511 of frame 500.

At 607, the descrambling circuit generates a descrambled bit estimate sequence based at least in part on the encoded descrambling sequence(s) 433 and the bit estimate sequence 431. For example, the descrambling circuit includes multiplier circuit 411 that multiplies the bit estimate sequence 431 by the encoded descrambling sequence(s) 433.

At 609, controller 419 of FIG. 4 determines whether the descrambled bit estimate sequence corresponds to a retransmission of any of stored descrambled bit estimate sequences stored in buffers 413. In response to a determination that the descrambled bit estimate sequence corresponds to a retransmission of one or more stored descrambled bit estimate sequences, at 611 the adder circuit 415 combines the descrambled bit estimate sequence with the one or more stored descrambled bit estimate sequences.

At 613, a decoder, such as decoder 417 of FIG. 4, decodes the combined descrambled bit estimate sequence. The decoded combined descrambled bit estimate sequence is sent to upper layers of, for example, system 400 of FIG. 4 for further analysis and/or use. For example, the decoded combined descrambled bit estimate sequence can be examined to determine whether any error has occurred during the propagation of the frames on the channel and/or during the reception of the frames. In some embodiments, controller 419 can be configured to examine the decoded combined descrambled bit estimate sequence.

Figure 7:
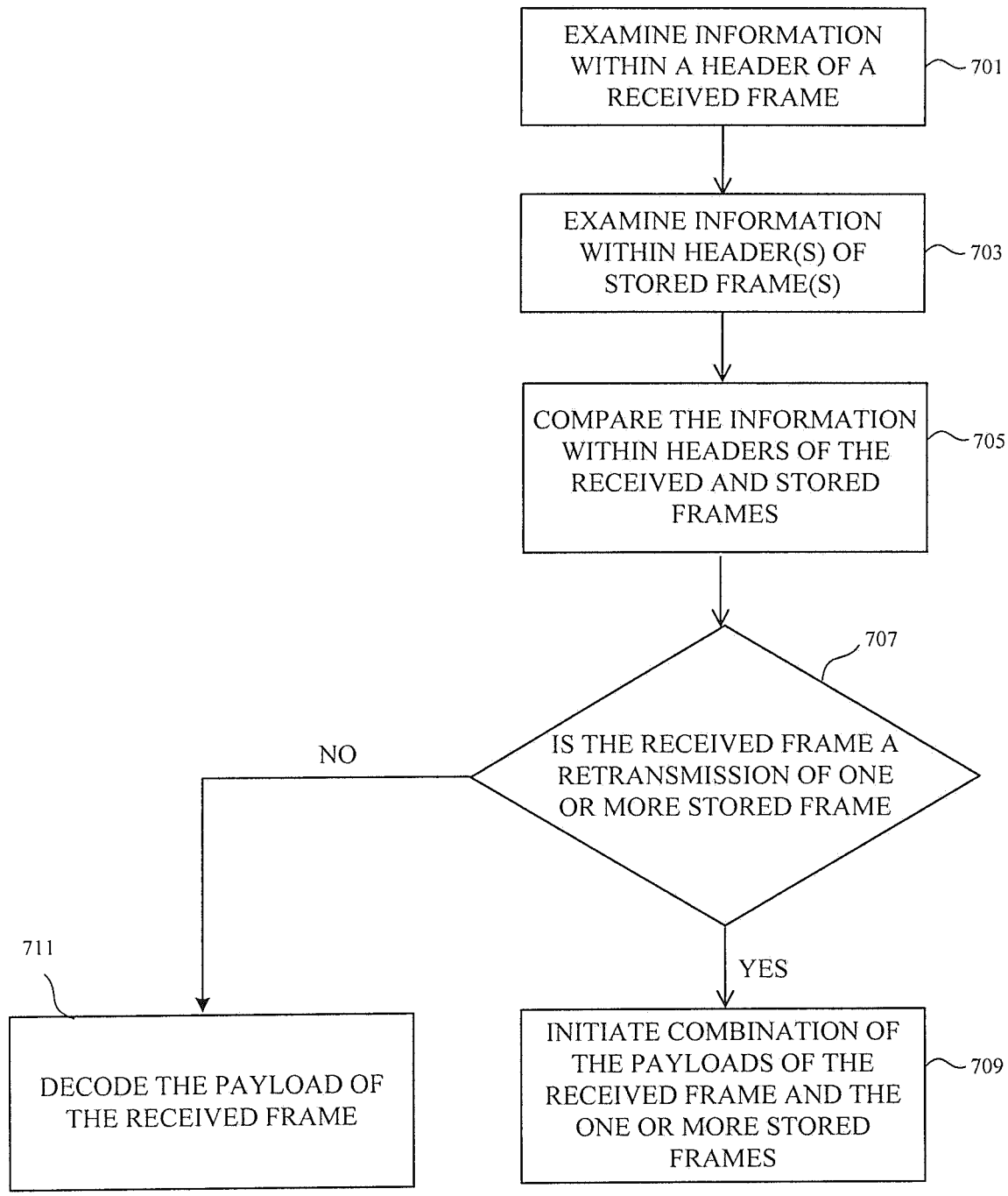
FIG. 7 illustrates an example method for determining whether the descrambled bit estimate sequence corresponds to a retransmission of any of stored descrambled bit estimate sequences, according to some embodiment of the disclosure.

FIG. 7 illustrates an example method 700 for determining whether the descrambled bit estimate sequence corresponds to a retransmission of any of stored descrambled bit estimate sequences stored at buffers, according to some embodiment. As a convenience and not a limitation, FIG. 7 is described with respect to FIGS. 1, 4, and 5. But method 700 not limited to the specific embodiments depicted in those figures and other systems may be used to perform the method as will be understood by those skilled in the arts. It is to be appreciated not all steps may be needed, and the steps may not be performed in the same order as shown in FIG. 7. Method 700 can be performed as part of step 609 of method 600 of FIG. 6.

At 701, a controller such as controller 419 of FIG. 4 examines information within a header of a received frame. For example, controller 419 of FIG. 4 examines information within MAC header 521 of frame 500 of FIG. 5.

At 703, the controller such as controller 419 of FIG. 4 also examines information within header(s) of frame(s) stored at buffers 413 of FIG. 4. For example, controller 419 examines information within MAC header(s) of the stored frame(s).

According to some embodiments, the information within the header examined by controller 419 can include frame control 501 of MAC header 521 to determine whether the frame is a data frame, a control frame, or a management frame. The information can further include the retransmission field within frame control 501. The information can also include address(es) 505 (e.g., the address of the transmitter, the address of the receiver.) The information can further include the TID field of QoS control 509. In other words, the controller can determine with the TID field of a current frame matches that of any of one or more stored frames in the buffers 413.

At 705, controller 419 compares the information within the header of the received frame with the information within the header(s) of the stored frame(s). At 707, based on the comparison, controller 419 determines whether the received frame is a retransmission of one or more stored frames. In response to a determination that the received frame is a retransmission of one or more stored frames, at 709, controller 419 can initiate the combination of the payloads of the received frame and the one or more stored frames (e.g., 611 of FIG. 6.)

According to some embodiments, controller 419 can determine that the received frame is a retransmission of one or more stored frames when some information within the header of the received frame and the one or more stored frames match. For example, when the address of the transmitter of the frames, the address of the receiver of the frames, and the TID associated with the frames match, controller 419 determines that the received frame is a retransmission of one or more stored frames.

In response to a determination that the received frame is not a retransmission of one or more stored frame, at 711, the payload of the received frame can be decoded using, for example, decoder 417 without combining the payload of the received frame with any other payload(s).

Figure 8:
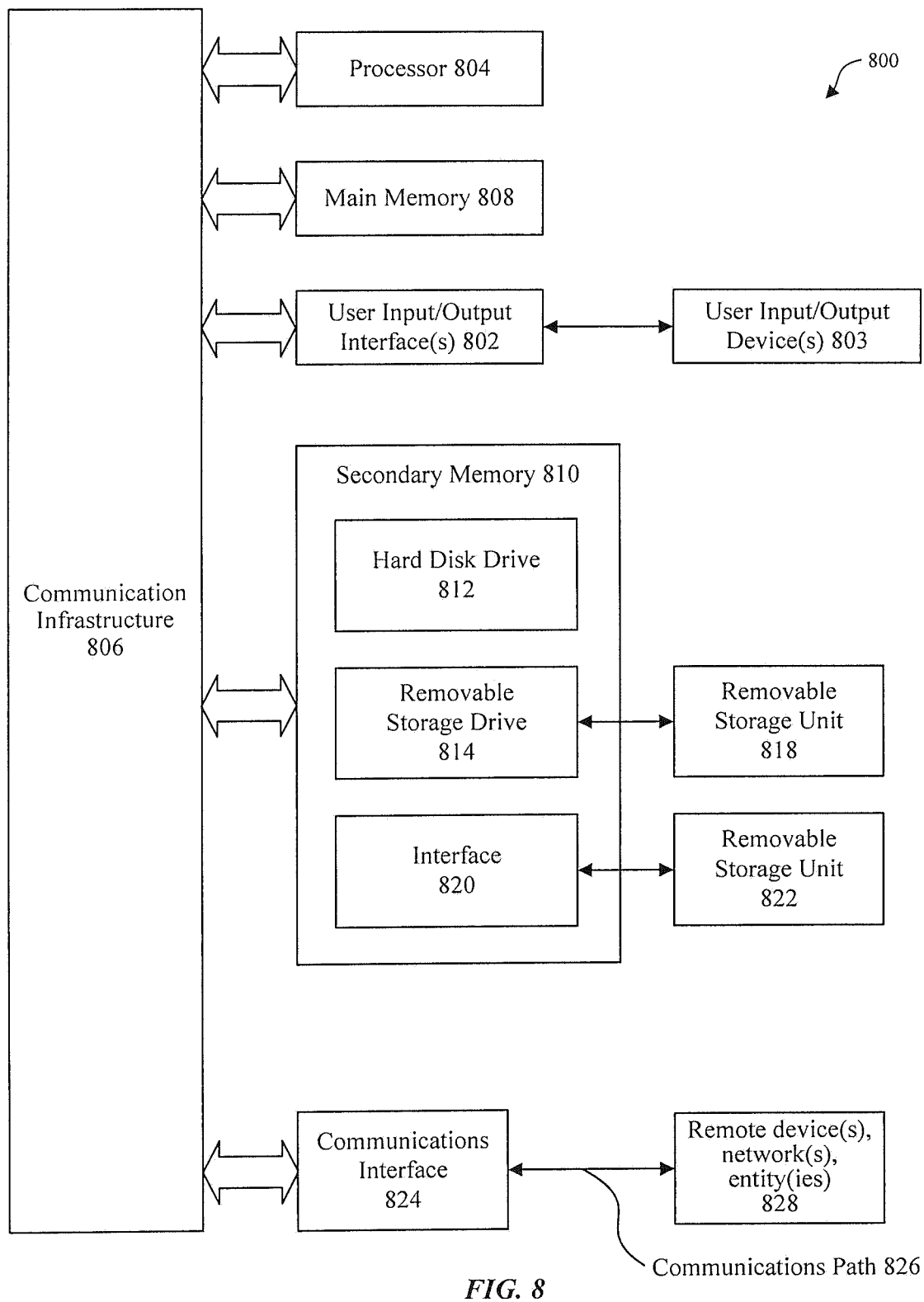
FIG. 8 is an example computer system for implementing some embodiments or portion(s) thereof.

Various embodiments can be implemented, for example, using one or more computer systems, such as computer system 800 shown in FIG. 8. Computer system 800 can be used, for example, to implement method discussed in this disclosure such as, but not limited to, method 600 of FIG. 6 and/or method 700 of FIG. 7. Also, one or more of stations 120, AP 110, system 300, system 400, or part of the devices and systems may be implemented using computer system 800. Computer system 800 can be any computer capable of performing the functions described herein, for example, implementing hybrid automatic repeat request (hybrid ARQ—HARQ) and soft combining of multiple transmissions to improve PER, channel capacity, and aggregated throughput.

Computer system 800 includes one or more processors (also called central processing units, or CPUs), such as a processor 804. Processor 804 is connected to a communication infrastructure 806 (e.g., a bus.) Computer system 800 also includes user input/output device(s) 803, such as monitors, keyboards, pointing devices, etc., that communicate with communication infrastructure 1006 through user input/output interface(s) 802. Computer system 800 also includes a main or primary memory 808, such as random access memory (RAM). Main memory 808 may include one or more levels of cache. Main memory 808 has stored therein control logic (e.g., computer software) and/or data.

Computer system 800 may also include one or more secondary storage devices or memory 810. Secondary memory 810 may include, for example, a hard disk drive 812 and/or a removable storage device or drive 814. Removable storage drive 814 may be a floppy disk drive, a magnetic tape drive, a compact disk drive, an optical storage device, tape backup device, and/or any other storage device/drive.

Removable storage drive 814 may interact with a removable storage unit 818. Removable storage unit 818 includes a computer usable or readable storage device having stored thereon computer software (control logic) and/or data. Removable storage unit 818 may be a floppy disk, magnetic tape, compact disk, DVD, optical storage disk, and/any other computer data storage device. Removable storage drive 814 reads from and/or writes to removable storage unit 818 in a well-known manner.

According to some embodiments, secondary memory 810 may include other means, instrumentalities or other approaches for allowing computer programs and/or other instructions and/or data to be accessed by computer system 800. Such means, instrumentalities or other approaches may include, for example, a removable storage unit 822 and an interface 820. Examples of the removable storage unit 822 and the interface 820 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 800 may further include a communication or network interface 824. Communication interface 824 enables computer system 800 to communicate and interact with any combination of remote devices, remote networks, remote entities, etc. (individually and collectively referenced by reference number 828). For example, communication interface 824 may allow computer system 800 to communicate with remote devices 828 over communications path 826, which may be wired and/or wireless, and which may include any combination of LANs, WANs, the Internet, etc. Control logic and/or data may be transmitted to and from computer system 800 via communication path 826.

The operations in the preceding embodiments can be implemented in a wide variety of configurations and architectures. Therefore, some or all of the operations in the preceding embodiments may be performed in hardware, in software or both. In some embodiments, a tangible, non-transitory apparatus or article of manufacture includes a tangible, non-transitory computer useable or readable medium having control logic (software) stored thereon is also referred to herein as a computer program product or program storage device. This includes, but is not limited to, computer system 800, main memory 808, secondary memory 810 and removable storage units 818 and 822, as well as tangible articles of manufacture embodying any combination of the foregoing. Such control logic, when executed by one or more data processing devices (such as computer system 800), causes such data processing devices to operate as described herein.

Based on the teachings contained in this disclosure, it will be apparent to persons skilled in the relevant art(s) how to make and use embodiments of the disclosure using data processing devices, computer systems and/or computer architectures other than that shown in FIG. 8. In particular, embodiments may operate with software, hardware, and/or operating system implementations other than those described herein.

It is to be appreciated that the Detailed Description section, and not the Summary and Abstract sections, is intended to be used to interpret the claims. The Summary and Abstract sections may set forth one or more but not all exemplary embodiments of the disclosure as contemplated by the inventor(s), and thus, are not intended to limit the disclosure or the appended claims in any way.

While the disclosure has been described herein with reference to exemplary embodiments for exemplary fields and applications, it should be understood that the disclosure is not limited thereto. Other embodiments and modifications thereto are possible, and are within the scope and spirit of the disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. In addition, alternative embodiments may perform functional blocks, steps, operations, methods, etc. using orderings different from those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the disclosure should not be limited by any of the above-described exemplary embodiments, but should be defined only in accordance with the following claims and their equivalents.

What is claimed is:

1. An electronic device, comprising:
   a buffer configured to store a first descrambled bit estimate sequence;
   an encoder configured to receive a descrambling sequence and generate an encoded descrambling sequence based on the descrambling sequence, wherein the encoder comprises at least one of a Binary Convolution Code (BCC) encoder, a low-density parity-check (LDPC), or a forward error correction (FEC) encoder;
   a multiplier circuit configured to receive a bit estimate sequence and the encoded descrambling sequence and generate a second descrambled bit estimate sequence, wherein the bit estimate sequence is based on a frame received from an other electronic device and wherein the received frame comprises scrambled payload bits that were subsequently encoded by the other electronic device;
a controller configured to:
  determine whether the second descrambled bit estimate sequence corresponds to a retransmission of the first descrambled bit estimate sequence; and
  when the second descrambled bit estimate sequence corresponds to the retransmission of the first descrambled bit estimate sequence, control an adder circuit to combine the first descrambled bit estimate sequence and the second descrambled bit estimate sequence; and
a decoder configured to decode the combined descrambled bit estimate sequence when the second descrambled bit estimate sequence corresponds to the retransmission of the first descrambled bit estimate sequence.

2. The electronic device of claim 1, further comprising:
a demapper circuit configured to generate the bit estimate sequence based on a bit sequence of the frame received at the electronic device from the other electronic device,
wherein, when the second descrambled bit estimate sequence does not correspond to the retransmission of the first descrambled bit estimate sequence, the controller is further configured to control the adder circuit to pass the second descrambled bit estimate sequence to the decoder without combining the first descrambled bit estimate sequence and the second descrambled bit estimate sequence, and
wherein the decoder is further configured to decode the second descrambled bit estimate sequence when the second descrambled bit estimate sequence does not correspond to the retransmission of the first descrambled bit estimate sequence.

3. The electronic device of claim 2, wherein the demapper circuit is configured to operate based at least in part on log-likelihood ratio (LLR) estimation.

4. The electronic device of claim 1, wherein
the frame is received at the electronic device from an access point of a wireless local area network (WLAN).

5. The electronic device of claim 1, wherein to determine whether the second descrambled bit estimate sequence corresponds to the retransmission of the first descrambled bit estimate sequence, the controller is configured to:
compare a transmitter address associated with the second descrambled bit estimate sequence with a transmitter address associated with the first descrambled bit estimate sequence.

6. The electronic device of claim 1, wherein to determine whether the second descrambled bit estimate sequence corresponds to the retransmission of the first descrambled bit estimate sequence, the controller is configured to:
compare a receiver address associated with the second descrambled bit estimate sequence with a receiver address associated with the first descrambled bit estimate sequence.

7. The electronic device of claim 1, wherein to determine whether the second descrambled bit estimate sequence corresponds to the retransmission of the first descrambled bit estimate sequence, the controller is configured to:
compare a traffic identifier (TID) associated with the second descrambled bit estimate sequence with a TID associated with the first descrambled bit estimate sequence.

8. The electronic device of claim 1, wherein the controller is configured to determine that the second descrambled bit estimate sequence corresponds to the retransmission of the first descrambled bit estimate sequence in response to:
a transmitter address associated with the second descrambled bit estimate sequence being same as a transmitter address associated with the first descrambled bit estimate sequence,
a receiver address associated with the second descrambled bit estimate sequence being same as a receiver address associated with the first descrambled bit estimate sequence, or
a traffic identifier (TID) associated with the second descrambled bit estimate sequence being same as a TID associated with the first descrambled bit estimate sequence.

9. The electronic device of claim 1, further comprising:
a plurality of buffers configured to store a plurality of descrambled bit estimate sequences including the first descrambled bit estimate sequence, wherein each of the plurality of descrambled bit estimate sequences is associated with a respective traffic identifier (TID).

10. The electronic device of claim 1, wherein the encoder comprises an encoder with linear operation.

11. An electronic device, comprising:
a memory that stores program instructions and a first descrambled bit estimate sequence; and
a processor, upon executing the program instructions, configured to:
  generate a bit estimate sequence based on a frame received at the electronic device from an other electronic device, wherein the frame comprises scrambled payload bits that were subsequently encoded;
  receive a descrambling sequence and generate, using an encoder, an encoded descrambling sequence based on the descrambling sequence, wherein the encoder comprises at least one of a Binary Convolution Code (BCC) encoder, a low-density parity-check (LDPC), or a forward error correction (FEC) encoder;
  generate a second descrambled bit estimate sequence based at least in part on the bit estimate sequence and the encoded descrambling sequence;
  determine whether the second descrambled bit estimate sequence corresponds to a retransmission of the first descrambled bit estimate sequence;
  when the second descrambled bit estimate sequence corresponds to the retransmission of the first descrambled bit estimate sequence:
    combine the first descrambled bit estimate sequence and the second descrambled bit estimate sequence; and
    decode the combined descrambled bit estimate sequence.

12. The electronic device of claim 11, wherein the processor is further configured to:
compare a transmitter address associated with the second descrambled bit estimate sequence with a transmitter address associated with the first descrambled bit estimate sequence.

13. The electronic device of claim 11, wherein the processor is further configured to:

compare a receiver address associated with the second descrambled bit estimate sequence with a receiver address associated with the first descrambled bit estimate sequence.

14. The electronic device of claim 11, wherein the processor is further configured to:
compare a traffic identifier (TID) associated with the second descrambled bit estimate sequence with a TID associated with the first descrambled bit estimate sequence.

15. The electronic device of claim 11, wherein the processor is configured to determine that the second descrambled bit estimate sequence corresponds to the retransmission of the first descrambled bit estimate sequence in response to:
a transmitter address associated with the second descrambled bit estimate sequence being same as a transmitter address associated with the first descrambled bit estimate sequence,
a receiver address associated with the second descrambled bit estimate sequence being same as a receiver address associated with the first descrambled bit estimate sequence, or
a traffic identifier (TID) associated with the second descrambled bit estimate sequence being same as a TID associated with the first descrambled bit estimate sequence.

16. The electronic device of claim 11, wherein the frame is received at the electronic device from an access point of a wireless local area network.

17. The electronic device of claim 16, wherein the processor is configured to use log-likelihood ratio estimation to generate the bit estimate sequence.

18. The electronic device of claim 11, wherein the first descrambled bit estimate sequence is one of a plurality of descrambled bit estimate sequences stored by the memory, wherein each of the plurality of descrambled bit estimate sequences is associated with a respective traffic identifier (TID).

19. A method, comprising:
generating a bit estimate sequence based on a frame received from an other electronic device, wherein the received frame comprises scrambled payload bits that were subsequently encoded by the other electronic device;
receiving a descrambling sequence;
generating, using an encoder, an encoded descrambling sequence based on the descrambling sequence, wherein the encoder comprises at least one of a Binary Convolution Code (BCC) encoder, a low-density parity-check (LDPC), or a forward error correction (FEC) encoder;
generating a first descrambled bit estimate sequence based at least in part on the bit estimate sequence and the encoded descrambling sequence;
determining whether the first descrambled bit estimate sequence corresponds to a retransmission of a stored second descrambled bit estimate sequence;
when the first descrambled bit estimate sequence corresponds to the retransmission of the stored second descrambled bit estimate sequence:
combining the first descrambled bit estimate sequence and the stored second descrambled bit estimate sequence; and
decoding the combined descrambled bit estimate sequence.

20. The method of claim 19, wherein the determining that the first descrambled bit estimate sequence corresponds to the retransmission of the stored second descrambled bit estimate sequence comprises:
determining that a transmitter address associated with the first descrambled bit estimate sequence is same as a transmitter address associated with the second descrambled bit estimate sequence;
determining that a receiver address associated with the first descrambled bit estimate sequence is same as a receiver address associated with the second descrambled bit estimate sequence; or determining that a traffic identifier (TID) associated with the first descrambled bit estimate sequence is same as a TID associated with the second descrambled bit estimate sequence.

* * * * *